United States Patent [19]

O'Donoghue et al.

[11] Patent Number: 5,497,381
[45] Date of Patent: Mar. 5, 1996

[54] BITSTREAM DEFECT ANALYSIS METHOD FOR INTEGRATED CIRCUITS

[75] Inventors: Geoffrey P. O'Donoghue, Andover; Gary C. Cheek, Wilmington, both of Mass.

[73] Assignee: Analog Devices, Inc., Norwood, Mass.

[21] Appl. No.: 458,020

[22] Filed: Jun. 1, 1995

Related U.S. Application Data

[63] Continuation of Ser. No. 137,296, Oct. 15, 1993, abandoned.

[51] Int. Cl.[6] .................................................. G06F 11/10
[52] U.S. Cl. .............................. 371/28; 271/25.1; 271/26
[58] Field of Search ............................................. 371/29.1

[56] References Cited

PUBLICATIONS

Cheek and O'Donoghue, "Yield Modeling in a DFM Environment: A Bibliography", *International Semiconductor Manufacturing Science Symposium*, San Francisco, 1993.
Kiberian and Strojwas, "Using Spatial Information To Analyze Correlations Between Test Structure Data", *IEEE Transactions on Semiconductor Manufacturing*, vol. 4, No. 3, Aug. 1991.
Stapper et al., "Integrated Circuit Yield Statistics", *Proceedings of the IEEE*, vol. 71, No. 4, Apr. 1983.
Riodan and Vasques, "Statistical Bin Limits: Containing Factory Excursions Near the Source", *18th Annual Reliability Testing Institute*, University of Arizona, May 1992.
Hoel, *Elementary Statistics*, 2d, Ed., John Wiley & Sons, 1966, pp. 258–260 and 284–287.
Oppenheim and Schafer, *Digital Signal Processing*, Prentice Hall, 1975.
Oppenheim & Schaffer, *Digital Signal Processing*, Prentice-Hall, 1975, pp. 195–197, and 137–239.
Stapper et al., "*Integrated Circuit Yield Statistics*", Proceedings of the IEEE, vol. 71, No. 4, Apr., 1983, pp. 453–470.
Riordan and Vasquez, "*Statistical Bin Limits: Containing Factory Excursions Near and the Source*", 18th Annual Reliability Testing Institute, University of Arizona, May, 1992, pp. 1–14.
Hoel, *Elementary Statistics*, 2d Ed., John Wiley & Sons, 1966, pp. 257–260 and 284–287.
Cheek and O'Donoghue, "Yield Models in a Design for Manufacturability Environment: A Bibliography", International Semiconductor Manufacturing Science Symposium, San Francisco, 1993, pp. 133–135.
Kiberian and Strojwas, "*Using Spatial Information to Analyze Correlations Between Test Structure Data*", IEEE Transactions on Semiconductor Manufacturing, vol. 4, No. 3, Aug., 1991, pp. 219–225.

*Primary Examiner*—Vincent P. Canney
*Attorney, Agent, or Firm*—Koppel & Jacobs

[57] ABSTRACT

Defects in the manufacturing of IC devices are analyzed by testing the devices for defects, generating a serial digital data bitstream upon which the test result for each device is encoded in succession, and operating upon the data bitstream to analyze the device defects. This allows for the use of rapid and reliable digital signal processing techniques to perform the analysis. The types of analyses that can be performed include the determination of non-random yields to distinguish random from systematic defects, comparisons with signature defect patterns that correspond to various systematic faults, and yield predictions for other circuits manufactured with a similar process but having a different critical circuit area. An improved windowing technique is used to determine non-random defects, in which normalized defect counts are obtained and compared for various window sizes. Multiple functional and parametric tests for each device can be accommodated in several ways, including the assignment of additional data bits in the bitstream to the additional tests. The defect analysis can be performed in real-time on one batch while the next batch is being processed, with the results of the analysis used to correct the manufacturing process if systematic defects are identified. An improved method is also described for calculating the non-random yield loss factor $Y_o$, which can be used in yield models for yield prediction purposes.

14 Claims, 4 Drawing Sheets

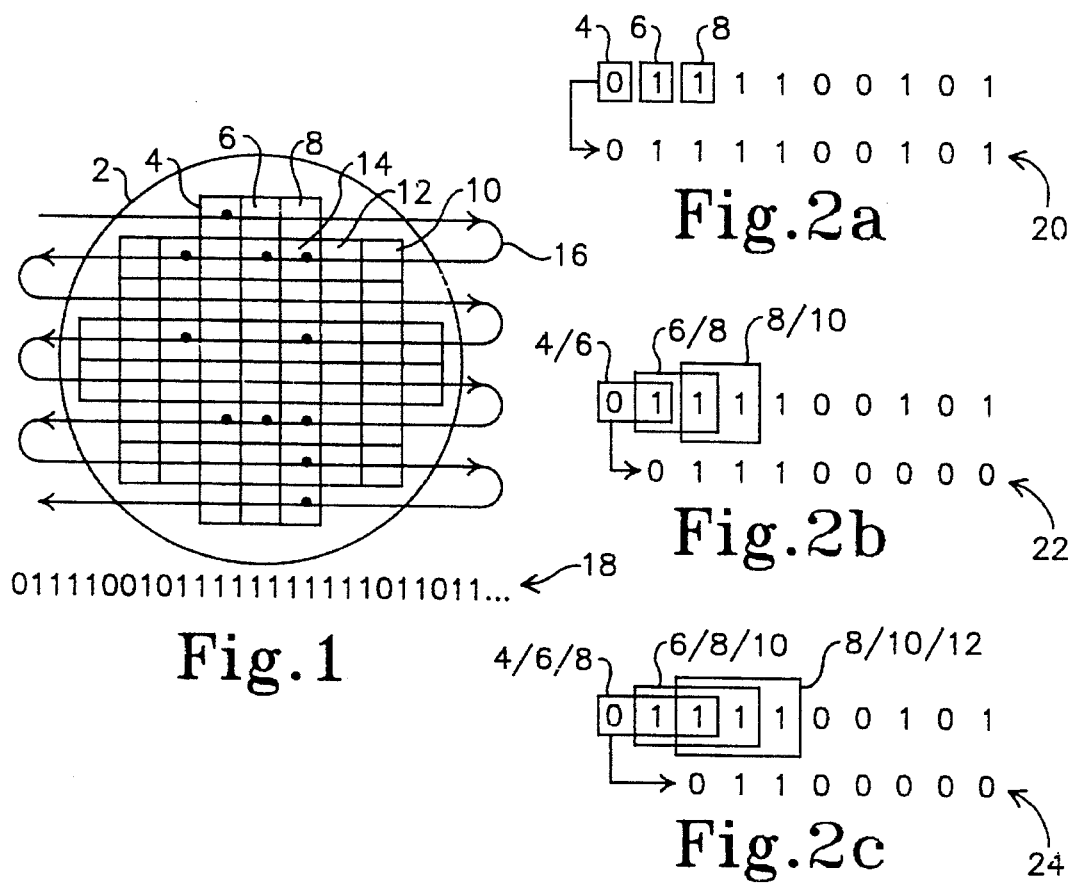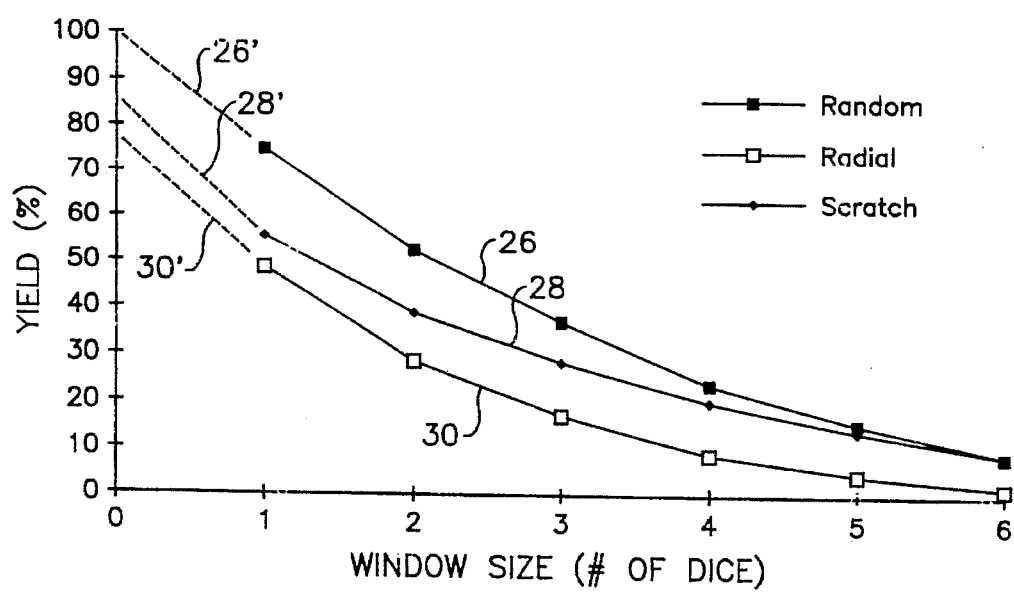

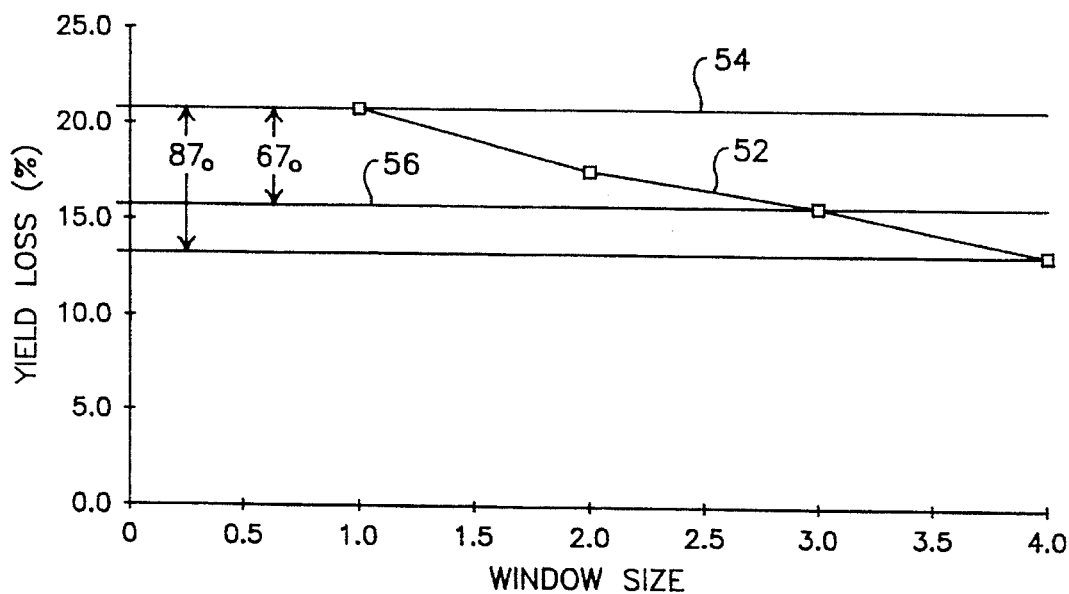
Fig.6
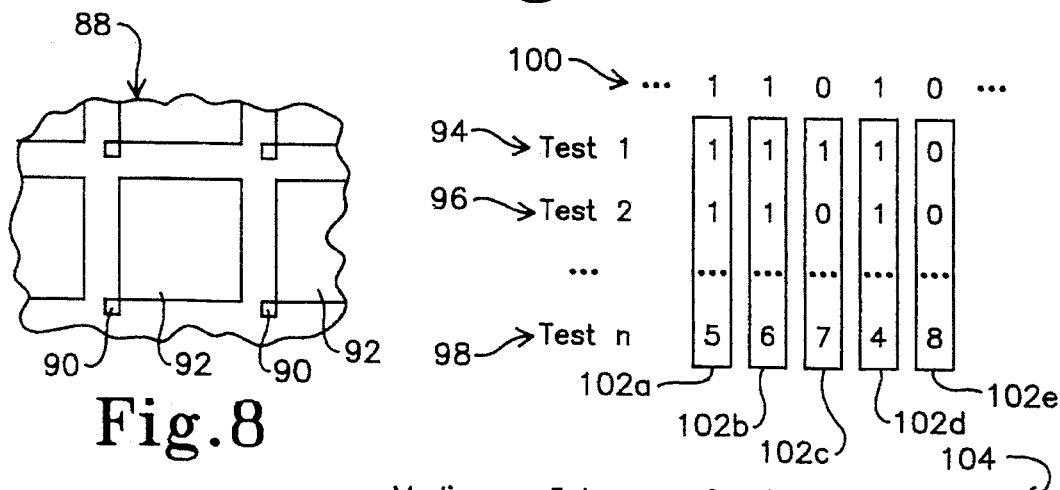
Fig.8
Fig.9
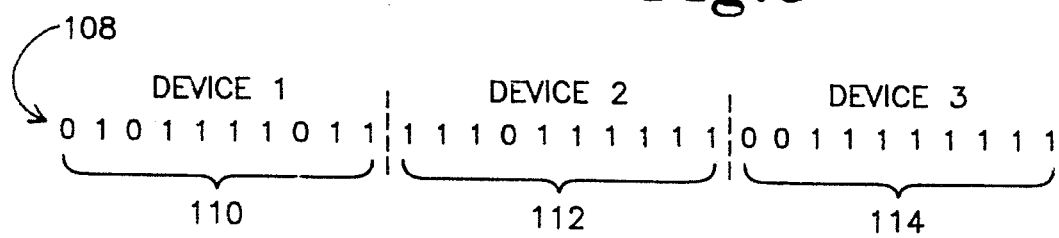
Fig.10

BITSTREAM DEFECT ANALYSIS METHOD FOR INTEGRATED CIRCUITS

This is a continuation of application Ser. No. 08/137,296, filed on Oct. 15, 1993, now abandoned.

BACKGROUND OF THE INVENTION

1. Field of the Invention

This invention relates to the analysis of defects detected in integrated circuit (IC) devices, and more particularly to the encoding of test results for multiple IC devices into a serial digital data bitstream for digital signal processing (DSP) analysis.

2. Description of the Related Art

With modern manufacturing techniques, the yield of digital CMOS or memory circuits is primarily limited by random defects that result from random effects such as dust particles or other materials floating in the air, a person coughing or sneezing, etc. Non-random (systematic) defects that result from problems with the manufacturing process and are reproduced regularly on successive ICs, as well as parametric defects in which a part may not quite meet specifications but is still functional, are reduced or eliminated through rapid learning techniques during the course of manufacturing products in large volumes. Several yield models have been developed to calculate defect limited yield as a function of die area and defect density; see Cheek and O'Donoghue, "Yield Modeling in a DFM Environment: A Bibliography", *International Semiconductor Manufacturing Science Symposium*, San Francisco, 1993.

The validity of such yield models is based upon several assumptions. First, it is assumed that the spatial defect distribution on the wafer surface is random or clustered random. Second, the parametric component of yield loss is assumed to be negligible. Third, the number of gross process induced defects on the wafer is assumed to be small. Finally, a significant portion of the circuitry is assumed to be highly dense, resulting in a relatively large critical area (that region of a circuit in which the presence of a defect will result in a catastrophic failure).

For analog or mixed analog/digital circuits, however, the above assumptions for random defect limited yield do not apply. These circuits typically have smaller critical areas than digital circuits, and are more sensitive to process parameter variations and systematic process induced defects. An identification of the root cause of yield loss on analog circuitry requires that the various mechanisms contributing to the effective defect density, such as random defects versus systematic defects and gross defects versus parametric defects, be distinguished from each other.

Yield models used for digital or memory yield prediction use two parameters: defect density and die or chip area. The defect density is a curve fitted parameter based upon the relationship between die area and measured yield. It is used to model all yield loss mechanisms. However, for mixed-signal or analog circuits, where all yield loss cannot be accounted for by a defect density, an additional parameter that represents systematic or non-random yield loss is necessary. The purpose of the analysis is to identify systematic yield loss components in real time and also to quantify a general $Y_o$ (non-random yield loss) parameter for use in yield models.

IC chips are fabricated as separate dice on semiconductor wafers. Each die is probed for testing, with failing dice marked with an ink spot. The passing dice are taken from the wafer and assembled into packaged parts, which are again tested. The patterns of good and failing chips at either a wafer or a packaged part level have been used to identify underlying problems in the manufacturing process. This has involved generating a two-dimensional wafer pattern map upon which the defective chips are noted, overlying the wafer defect maps on wafer "signature" maps which display typical defect patterns for various manufacturing line problems, and manually comparing the two in an effort to establish correlations. The identification of statistical trends and development of correlation models has also been used for fault diagnosis; see Kiberian and Strojwas, "Using Spatial Information To Analyze Correlations Between Test Structure Data", *IEEE Transactions on Semiconductor Manufacturing*, Vol. 4, No. 3, August 1991. However, the graphical analysis of two-dimensional wafer patterns is an interactive and time consuming process and not practical for application in a real time manufacturing flow.

Another technique that has been used to determine the systematic versus random components of yield loss involves "windowing" on a wafer map. This technique is described, for example, in Stapper et al., "Integrated Circuit Yield Statistics", *Proceedings of the IEEE*, Vol 71, No 4, April 1983. It allows the yield to be determined as a function of a "window" of increasing size that is moved around the wafer map. The window is increased from a single die size to two dice, three dice, four dice, and further multiples. Since the likelihood of a defect being included within a particular window area increases as the size of the window become greater, the yield experiences a corresponding reduction. The yields for different window sizes are plotted on the Y-axis of a logarithmic scale against the window area, which is plotted on the X-axis. The resulting curves are extended to intercept the Y-axis, at which the window size is a theoretical zero. The point at which the Y-axis is intercepted is referred to as $Y_o$, and is taken to represent the portion of the total defects attributable to random defects. While this technique provides an approximation of the random versus non-random components of defects that effect wafer yield, it is laborious, time consuming and not particularly accurate.

A further limitation on the amount of useful information that can be obtained with present defect analysis procedures stems from the nature of IC testing. Numerous different tests, up to 100 in number, are typically performed on each die. The tests generally begin with those having strict pass requirements, and are progressively relaxed for later tests. The distribution of the pass/fail results for the various tests, or for combinations of the tests, is referred to as the "bin distribution". The analysis of bin data is useful for manufacturing process control and long term reliability; see Riordan and Vasques, "Statistical Bin Limits: Containing Factory Excursions Near the Source", 18*th Annual Reliability Testing Institute*, University of Arizona, May, 1992.

The pattern of results at each different test level in the bin or test distribution provides additional information for identifying desirable corrections to the manufacturing process. The bin distribution is also useful in recategorizing a specific die which satisfies some but not all of the various tests, and can be used for applications which have relaxed specifications. However, the additional test data available from the bin distribution multiplies the time required to perform the test analysis.

SUMMARY OF THE INVENTION

The present invention seeks to provide a method of analyzing defects in IC devices that is faster and more reliable than the techniques that are presently in use.

This goal is accomplished by testing a sequence of IC devices for defects, generating a digital data bitstream in which different data bits correspond to the defect states of respective IC devices, and operating upon the data bitstream to analyze the defects. The data bits are preferably formatted in a serial stream, with the bits for each different IC device having respective assigned positions within the bitstream that correspond to the order in which the devices are tested. A single "pass/fail" bit can be assigned to each device, or multiple bits can be used for each device to provide a bin distribution.

The data bitstream can be processed to perform a windowing analysis in which random defects are distinguished from systematic defects. Once the systematic defects have been determined, the results can be used to predict the yield of other circuits that are manufactured by a similar process but have a different critical circuit area. An improved windowing technique is also provided in which defect counts are obtained for one or more multi-bit windows, normalized to the window size, and compared with the defect count for a single-bit window to provide an indication of $Y_o$; particular applications use either the normalized defect count for a four-bit window, or the average normalized defect counts for two-, three- and four-bit windows.

The invention is applicable to both IC dice fabricated on a common wafer, and to packaged IC parts. At the wafer stage, the data bitstream is preferably used to analyze the spatial defect pattern of the dice by correlating the defect pattern with signature patterns for different systematic defect conditions. The analysis technique is fast enough that the defects for one batch can be analyzed in real-time while the next batch is being processed. In this way the results of the defect analysis for the first batch can be used to modify the manufacturing process for subsequent batches to correct for detected systematic defects. Rapid processing is further enhanced by generating the data bitstream directly from the tester output, without manual intervention.

These and other features and advantages of the invention will be apparent to those skilled in the art from the following detailed description, taken together with the accompanying drawings.

BRIEF DESCRIPTION OF THE DRAWINGS

FIG. 1 is an illustrative plan view of a die layout on an IC wafer, showing a test sequence and the test results encoded in a serial data bitstream in accordance with the invention;

FIGS. 2a, 2b and 2c are illustrations of the application of a windowing technique to the data bitstream generated with the invention, to distinguish random from systematic defects;

FIG. 3 is a graph showing the results of applying the windowing technique of FIGS. 2a–2c to random, scratch and radial defects;

FIG. 6 is a graph illustrating the determination of $Y_o$ from the data presented in FIG. 5;

FIG. 8 is a fragmentary plan view of IC dice and associated test elements on an IC wafer whose testing can be analyzed with the invention;

FIG. 9 is an illustration of the generation of bitstreams corresponding to functional and parametric tests; and FIG. 10 illustrates a serial data bitstream in accordance with the invention, in which the results of bin testing have been encoded onto multiple data bits for each die in a serial bitstream.

DETAILED DESCRIPTION OF PREFERRED EMBODIMENTS

Figure 4A:
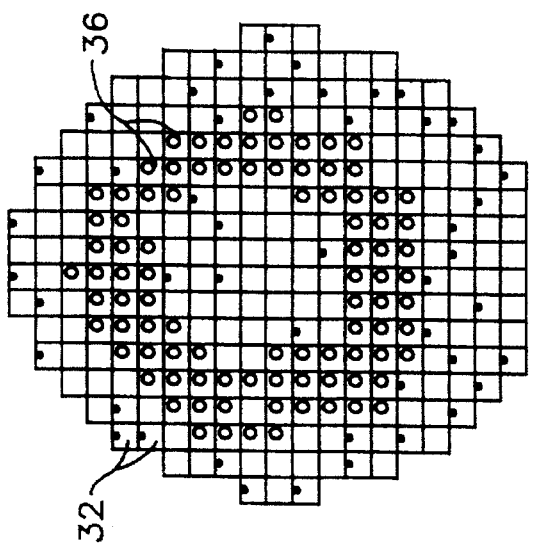
FIGS. 4a, 4b and 4c are plan views of an IC die layout in which random, scratch and radial defects are respectively illustrated.

FIG. 1 illustrates an example of how wafer level test data can be encoded into a serial data bitstream in accordance with the invention. Test data for packaged IC parts can be converted to a serial bitstream in a similar fashion, dependent upon the order of testing the parts. It is possible to combine multiple test bitstreams to form a single larger data bitstream, or to generate different bitstreams by combining other data about good or failing chips.

A die layout on an IC wafer 2 is shown, with the dice 4, 6, 8, 10, 12, 14, etc. arranged in successive rows on the wafer 2. The dice are tested in the order indicated by arrow 16, row by row in a raster scan fashion. The test results are encoded into a serial data bitstream 18 in which each data bit corresponds to the test result for a respective die.

The failing dice are indicated by a dot, while the passing dice are not marked. For example, dice 4 and 14 are shown as having failed, while dice 6, 8, 10 and 12 have passed. This is encoded onto the data bitstream 18 as a 0 for die 4, the first bit in the bitstream, and the first die to be tested, a 1 for the second tested die 6 in the second bit position, 1's in the third-fifth bit positions for the third-fifth dice 8, 10, 12 to be tested, and a 0 in the sixth bit position for the sixth die 14 to be tested. The test results for the remaining dice are encoded into the bitstream in a similar fashion, such that the total number of data bits in the bitstream equals the number of tested dice (plus any desired initiating bits at the beginning of the bitstream or termination bits at its end). The assignment of a "1" to a pass and a "0" to a fail is arbitrary; they could be switched, with the subsequent bitstream processing adjusted accordingly.

Converting the test results to a data bitstream in this fashion allows for a rapid and reliable analysis of the defect pattern through DSP techniques, rather than the manual graphical analysis previously used. The application of a windowing analysis to the data bitstream is illustrated in FIGS. 2a–2c. In practice, a computer would be programmed to automatically perform the analysis. The windowing computation is illustrated physically in the figures to provide an intuitive understanding.

In FIG. 2a the "window" size is equal to the area encompassed by a single die. The window is first placed over die 4, which failed the test. It is then moved over each of the dice in succession, beginning with die 6, then die 8, etc. The pass/fail status of the various dice are indicated in row 20, immediately below the windowed row. Since the window encompasses only one die at a time, the pass/fail window results displayed in row 20 correspond one-to-one to the individual dice. It should be noted that, although the dice are actually arranged in a two-dimensional array on the wafer, the data bitstream which represents the results of their testing is one-dimensional.

The next step of the windowing process is illustrated in FIG. 2b. The window size is increased so that it encompasses two dice. Thus, the first window position 4/6 encompasses dice 4 and 6, the second window position 6/8 encompasses dice 6 and 8, etc. The pass/fail status of the enlarged window positions is indicated on line 22. Since the window position 4/6 includes a defective die, the overall window fails; this is indicated by the initial 0 in row 22. The next window position 6/8 encompasses two good dice, so a 1 is generated for the second bit of the bitstream row 22. The remainder of bitstream 22 is generated in a similar manner, incrementing the enlarged window by one bit at each step.

The window is next enlarged so that it encompasses three dice, as illustrated in FIG. 2c. The first window position 4/6/8 encompasses dice 4, 6 and 8, and generates a 0 as the first bit of the output bitstream 24 since it includes a bad die. The next window position 6/8/10 encompasses the dice 6, 8 and 10, and generates a 1 in the second bit position of output bitstream 24 because all three bits within the window are good. The generation of the output bitstream 24 proceeds by incrementing the window in one die steps, as with the other window sizes.

The windowing technique continues with progressively larger window sizes. The yield for each window size is expressed as the percentage of window positions in which all of the die are good, compared to the total number of window positions. A yield-versus-window size plot is then made, with the yield on the Y-axis and the window size on the X-axis. Such a plot is illustrated by curve 26 in FIG. 3. Curve 26 represents the situation when all of the die defects are due to random causes, and none to systematic problems with the fabrication process. This can be seen from the fact that an extension 26' of the curve intercepts the Y-axis at the 100% yield level; a 100% yield at a theoretical 0 window size corresponds to 100% random defects.

FIG. 3 includes two additional curves 28 and 30. These curves illustrate the windowing results that may be obtained when a defect pattern due to a fault in the manufacturing equipment or processing technique is present. For example, curve 28 may represent the windowing results when the equipment causes a scratch across the wafer, while curve 30 could represent the results in the presence of a radial defect pattern on the wafer.

Figure 4B:
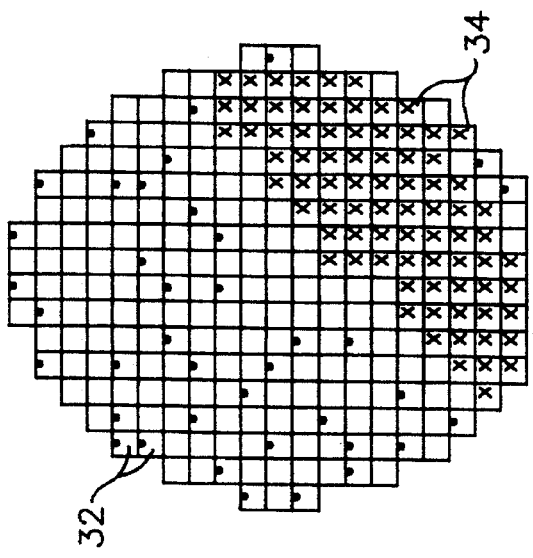
Figure 4C:
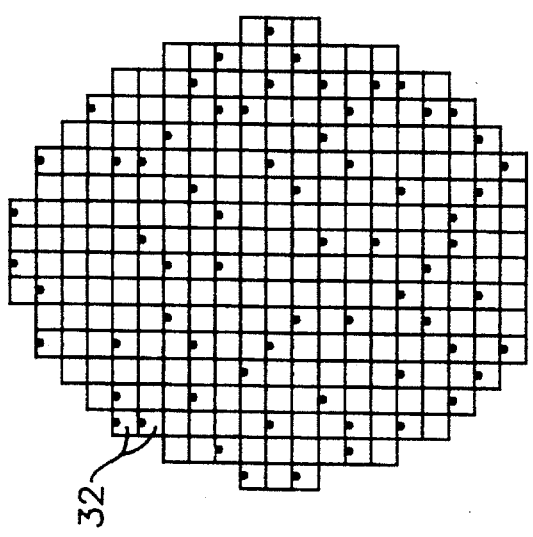

FIGS. 4a, 4b and 4c illustrate die patterns on IC wafers that have experienced random, scratch and radial defect patterns, respectively. In FIG. 4a only random defects, indicated by dots 32 on defective dice, are present. FIG. 4b illustrates another wafer with the same random defect pattern as FIG. 4a, but in which a systematic scratch defect pattern is also present, as indicated by X's 34. FIG. 4c illustrates another defect pattern which again has the same random defects 32 as FIGS. 4a and 4b, but in which a radial defect pattern (indicated by O's) 36 is present. During the IC manufacturing process, liquids are typically dropped onto the center of the wafer, which is spun rapidly to distribute the liquid over its surface; a radial defect pattern can result when the liquid is not spread evenly.

Models of defect patterns that result from numerous different processing faults can be established and translated into compound probability density functions for correlation with data bitstreams which represent measured test results. When a sufficiently high degree of correlation between the measured bitstream and the defect model is encountered, this can be used as a trouble shooting indicator that a problem exists with the manufacturing process, and of the nature of the problem.

Referring back to FIG. 3, it should be noted that extensions 28' and 30' of yield curves 28 and 30 intercept the Y-axis at levels less than 100%. This indicates that at least a portion of the defects are systematic rather than random. A correlation procedure as outlined immediately above can then be entered in an attempt to identify the source and nature of the systematic defects.

Figure 5:
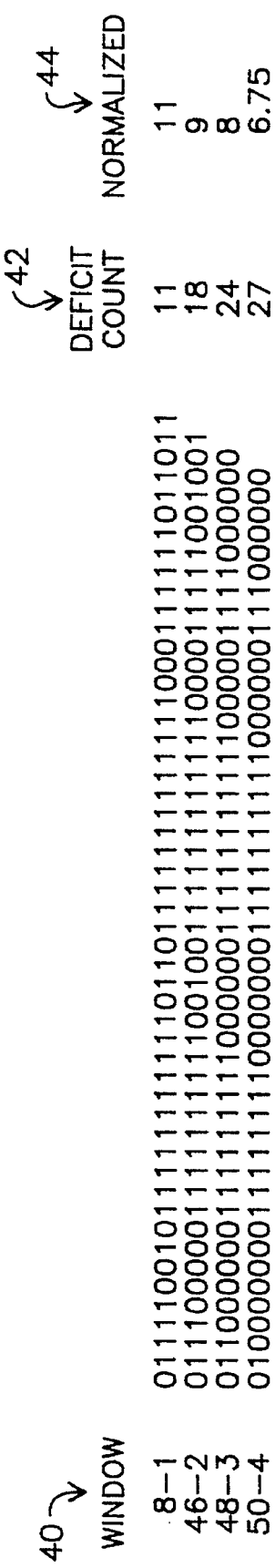
FIG. 5 is a bitstream representation illustrating the derivation of normalized defect counts used for an improved method of determining $Y_o$.

This technique for estimating $Y_o$ has not been found to be very accurate. An improved method is illustrated in FIGS. 5 and 6 that is particularly adapted to the data bitstreams provided with the present invention. Row 38 shows the full output bitstream of the 52-die wafer illustrated in FIG. 1, taken with a window size (column 40) of one bit. The defect count, or in other words the number of "0" bits, is shown in column 42. Column 44 gives the normalized defect count, which is the absolute defect count from column 42 divided by the number of windows that were used to generate the absolute defect count. Using the same technique as illustrated in connection with FIGS. 2a, 2b and 2c, the complete bitstreams for window sizes of two, three and four bits are given in rows 46, 48 and 50, respectively. The total defect count progressively increases as the window size goes up, starting at a count of 11 for a one-bit window and increasing to 18, 24 and 27 for two-, three- and four-bit windows, respectively. However, the normalized defect count progressively drops from a value of 11 for a one-bit window, to successive values of 9, 8 and 6.75. This reduction in the normalized defect count has been found to correspond to a reduction in $Y_o$, or in other words to the presence of systematic, non-random defects. Defect counts can be easily determined using a program such as the EXCEL® spreadsheet by Microsoft Corp. to sum the number of 1s in each bitstream and subtract these sums from the bitstream lengths.

FIG. 6 is a graph which plots the yield loss percentage for the normalized defect counts (as a percentage of 52 dice) against the window size. The resulting curve is identified by reference number 52, and is compared with a horizontal trace 54 that represents the actual defect count for a one-bit window. It has been found that a more accurate estimate of $Y_o$ can be obtained by comparing the normalized defect counts represented by curve 52, with the actual one-bit defect count represented by line 54. Although this mode of analysis is still somewhat tentative, a close correlation has been found between certain systematic defect patterns and the normalized defect count for a four-bit window. In the example of FIGS. 5 and 6 the latter value is 6.75, or about 13 percent for a 52-die wafer. By contrast, the one-bit defect count of 11 corresponds to a yield loss of about 21 percent. The difference, about 8 percent, has been observed to correspond closely with an observable $Y_o$ value for patterns that are similar to FIGS. 4b and 4c, but have fewer systematic defects. For other patterns, averaging the normalized defect counts for the two-bit, three-bit and four-bit window sizes produces a close approximation for $Y_o$; this averaged value is represented by line 56. When compared with the actual defect count, it represents a systematic yield loss of about 6 percent. The linear windowing method of calculating $Y_o$ is a deterministic and an algorithmic approach, whereas the previously used 2-D method is a curve fitting technique that is not deterministic but depends upon the order of the curve fitting parameters. The $Y_o$ or systematic parameter described above can also be used for mixed-signal or analog product yield planning, for example in a yield model.

Figure 7:
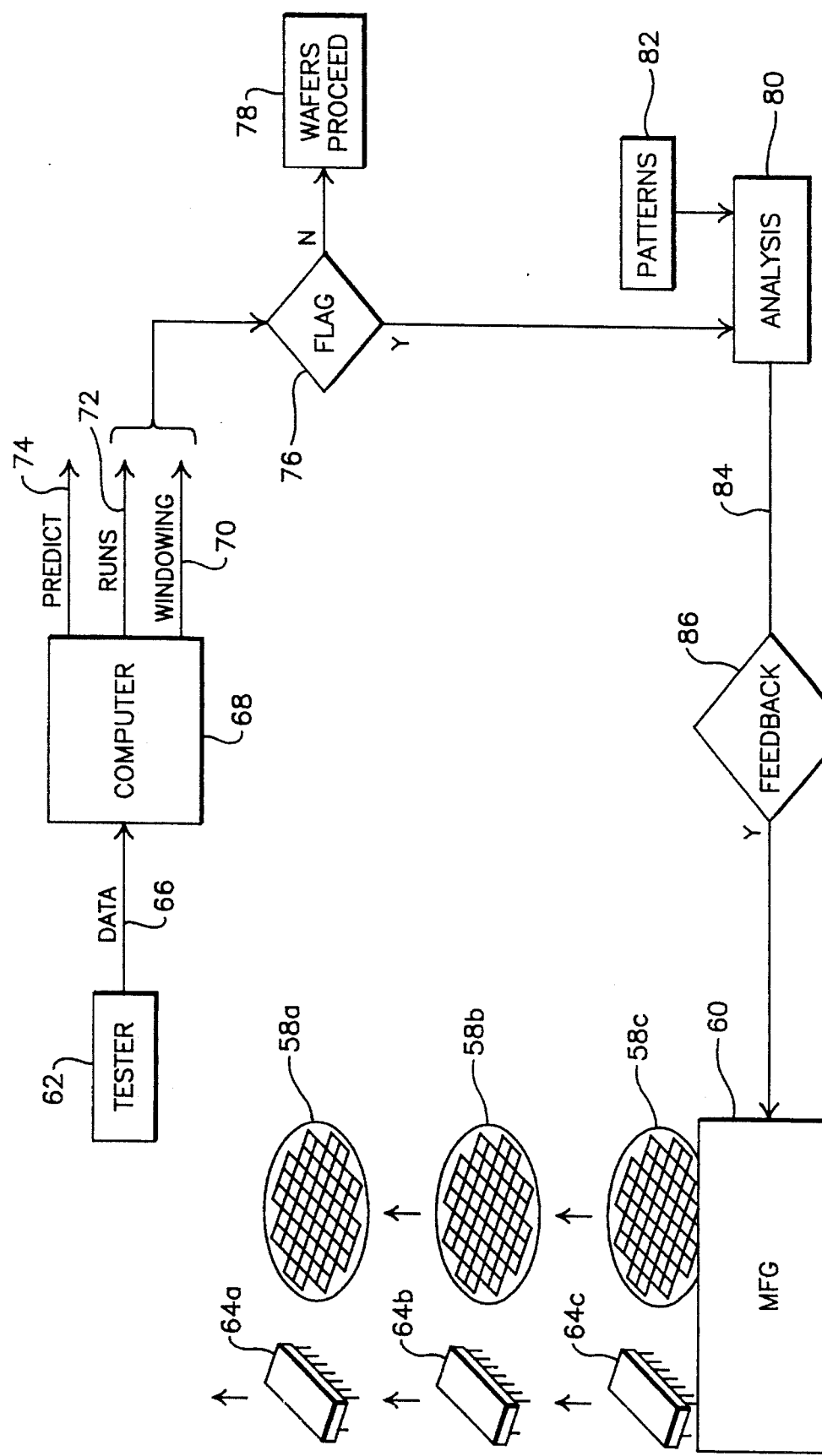
FIG. 7 is a block diagram of a test system that uses the invention.

FIG. 7 is a block diagram of a test and analysis system that can be used to implement the invention. A series of IC wafers 58a, 58b, 58c are shown emerging from a manufacturing line 60 and proceeding in sequence to a conventional automatic tester 62. The tester 62 includes a test head with an array of probes that are lowered onto a wafer to test each of the wafer dice in succession; a raster scan test sequence as illustrated in FIG. 1 would typically be employed. Instead of testing in the wafer state, the test procedure can be performed upon packaged IC parts 64a, 64b, 64c by contacting various lead combinations with the test probes.

Rather than providing a visual indication of the test results for each die, or in addition to a visual indication, the tester 62 provides an output signal over data line 66 to a computer 68. Presently available testers are generally capable of operating in either a datalog mode, in which individual test results for each die are output, or in a production mode in which output bitstreams are generated directly. In the datalog mode the test results would need to be converted to bitstreams suitable for the invention, with the particular conversion mechanism depending upon the individual tester. The computer 68 is programmed to operate upon the input test data bitstream to analyze the defect pattern and categorize the identified defects according to the relative densities of random and systematic defects. Such analysis can include a windowing procedure, either the conventional technique or the improved normalized defect count technique described above, to establish the random/systematic defect factor $Y_o$ (output line 70). A conventional statistical runs analysis, such as described in Hoel, *Elementary Statistics, 2d, Ed.,* John Wiley & Sons, 1966, pages 258–260 and 284–287, can also be programmed into the computer to estimate the non-randomness of defects, with an output on line 72. Furthermore, the non-randomness determination can be used to provide a prediction output 74 that can be used to predict the yield of other circuits that are fabricated with a similar manufacturing process, but have different critical circuit areas. The prediction output 74 is derived by projecting the measured defect pattern encoded onto the test bitstream to a device with a larger critical area. This is not a linear process, since doubling the critical area will normally more than double the percentage of defective dice.

The systematic/randomness indicator sets a convenient flag 76, such as a threshold device, when the degree of systemtic defects exceeds allowable limits. With a negative output from flag 76, the wafer manufacturing process is allowed to proceed (block 78). If the flag is set, however, the system proceeds to an analysis function 80 which attempts to determine the cause of the excessive systematic defect level. This analysis can be performed either in the computer 68, or in a separate computer or a digital signal processing (DSP) chip.

To implement a pattern analysis, serial data bitstreams that are encoded with signature defect patterns 82 for different types of processing faults are loaded into the analysis apparatus, which performs correlations between the signature pattern bitstreams and the actual test bitstreams from the wafers. The various comparisons and calculations are performed very rapidly using DSP techniques. These include low pass filtering, Z-domain analysis, and frequency domain analysis. See Oppenheim and Schafer, *Digital Signal Processing,* Prentice Hall, 1975, for a general description of such DSP processes. With modern computing capabilities, the digital processing is fast enough that the bitstream test results for one wafer or manufacturing batch can be analyzed in real time while the next wafer or batch is being processed. Once the cause of the systematic defects has been determined, the manufacturing process can be interrupted and the problem corrected to minimize the number of parts that are effected by the systematic process problem. This real-time intervention in the manufacturing process, based upon the real-time processing of test results, is indicated by feedback line 84, in which a decision block 86 represents the determination of whether or not the noted defects warrant an interruption of manufacturing.

FIG. 8 represents another application for the invention. In the manufacture of an IC wafer 88, test elements 90 can be fabricated next to the various dice 92, using the same manufacturing process. The relationship (if any exists) between parametic values for the test elements 90 (such as threshold voltage) and the functional status of the chip (pass/fail) is often sought. Two bitstreams are created, one from the chip test data, and the other from the test element data. If the test element values are indeed correlated to the functional status of the chips, the pattern of the bitstreams may be similar. A simple screening to determine whether it is worthwhile looking for this correlation is to perform a runs analysis on both bitstreams, to verify whether a statistical similarity exists between the chip functional status and the test element data.

Referring now to FIG. 9, the generation of single bitstreams from both multi-functional testing and parametric data is illustrated. Assume that a number of different functional tests have been performed; the results are given on lines 94 and 96 for the first two tests. Assume further that a parametric test which results in an analog value, such as offset voltage or access time, has also been performed; the results of the parametric test is given on line 98.

The results of the functional tests can be combined into a multivariate bitstream 100, in which a "1" is assigned if all of the tests for a given die resulted in a 1 (pass), while a "0" is assigned if one or more of the functional tests resulted in a 0 (fail). Thus, the multivariate bitstream for dice 102a–102e has 1s for bits 102a, 102b and 102d, whose functional tests all resulted in 1s, and a 0 for dice 102c and 102e, which each included one or more 0 test results. The multiple functional test data can be stored in a computer, which establishes the single multivariate bitstream 100 when the testing has been completed.

The generation of a bitstream for the parametric data is illustrated towards the bottom of the figure. Assume first that a median value of 5.1 is assigned to the parametric test results. A 1 or a 0 is assigned to the parametric test for each individual die, depending upon whether the test value exceeded or fell below the median value. This is illustrated by bitstream 104. Another bitstream 106 can be generated according to whether the parametric values exceed or fall below a particular threshold level, such as 6.1. The two parametric value bitstreams 104 and 106 can then be compared with each other by rapid digital processing techniques to identify dice whose parametric value falls between the median and threshold levels. If a substantial number of such dice are located, this may be an indication of a manufacturing process problem. Either one of the parametric data bitstreams, or both, can be provided along with the multivariate bitstream 100 for further processing.

Multi-functional testing is performed to obtain "bin distributions" of test data that provide more than just a single pass/fail test for each die. Up to 100 or so different test results may be obtained for each die. Instead of generating a single multivariate bitstream, the multi-functional testing can easily be handled by the invention simply by assigning multiple data bits within the bitstream for each die. For example, if ten different functional tests are performed, ten successive bit positions can be assigned to each die in the bitstream. This is illustrated in FIG. 10, in which thirty successive bits of a test result bitstream 108 are shown. The first ten bits 110 correspond to the results of the ten functional tests performed for the first device; the bits are preferably arranged in the bitstream in the same order as the sequence in which their corresponding tests are performed. The next group of ten bits 112 give the results of each of the ten functional tests performed on the second device, followed by the third group of ten bits 74 which provide the results of the tests for the third device, etc. Instead of formatting all of the test results into a single bitstream, ten different bitstreams could be generated, one for each different functional test. In this case the number of data bits in each bitstream would be equal to the number of tested devices. Test results in either format can be processed by known DSP techniques.

The provision of separate test results for each functional test adds significantly to the potential for accurately identifying the nature of manufacturing process faults that result in systematic defects in the tested parts. For example, separate windowing processes and defect pattern analyses could be performed for each different level of functional tests. The advantages of speed and reliability made possible by the present invention are even more pronounced for multi-functional testing, in which much more data is available for analysis, than in a single pass/fail test for each part.

While particular embodiments of the invention have been shown and described, numerous variations and alternate embodiments will occur to those skilled in the art. Accordingly, it is intended that the invention be limited only in terms of the appended claims.

We claim:

1. A method of controlling the fabrication of multiple integrated circuit (IC) dice fabricated on respective IC wafers, with each wafer having multiple dice, comprising:
   fabricating an IC wafer having multiple IC dice located at predetermined positions on the wafer,
   testing the IC dice on said IC wafer for defects in a sequence that corresponds to the positions of said dice on the wafer,
   encoding the results of said testing into an output signal in the form of a serial digital data bitstream with a bit sequence that corresponds to the test sequence and the positions of said dice on said wafer,
   operating upon the dice positional information in said data bitstream output signal to categorize defects identified in said dice by said testing, and
   modifying the fabrication for subsequent wafers based upon the results of said defect categorization.

2. The method of claim 1, wherein multiple respective data bits of said data bitstream are assigned to each of said dice.

3. The method of claim 2, wherein multiple tests are performed on each of said dice, and the results of different tests are encoded onto different data bits for each of said dice.

4. The method of claim 3, wherein said data bitstream is processed to distinguish between random and systematic defects in said dice.

5. The method of claim 4, wherein said data bitstream is processed by a windowing analysis to determine the non-random yield ($Y_o$) of said dice.

6. The method of claim 5, wherein said data bitstream is generated by assigning one bit state to data bits that correspond to defective dice, and a different bit state to data bits that correspond to non-defective dice, and said data bitstream is analyzed by:
   determining the number defective bit states in the bitstream,
   applying at least one multi-bit window to said bitstream to determine a respective defect count for such window, said defect counts being equal to the number of window positions that include at least one defective bit state for their respective window sizes,
   normalizing said defect counts by the number of bits included within their respective windows, and
   comparing the normalized defect count for at least one multi-bit window with the number of defective bit states in the bitstream to obtain an indication of the systematic defect rate in said dice.

7. The method of claim 6, wherein a four-bit window is applied to said bitstream, a normalized defect count is obtained for said four-bit window, and an indication of the systematic defect rate in said IC dice is obtained by comparing the normalized defect count of said four-bit window with the number of defective bit states in said bitstream.

8. The method of claim 7, wherein two-bit, three-bit and four-bit windows are applied to said bitstream, normalized defect counts are obtained for said two-, three- and four-bit windows, and an indication of the systematic defect rate in said IC dice is obtained by comparing the average of the normalized defect counts for said two-, three- and four-bit windows with the number of defective bit states in said bitstream.

9. The method of claim 4, wherein said dice have predetermined critical circuit areas, said wafer is manufactured by a predetermined manufacturing process, and said data bitstream is processed to predict the yield of dice on other wafers that are manufactured by a similar process but have different critical dice circuit areas, based upon the systematic defects determined for the dice under test.

10. The method of claim 1, wherein said data bitstream is processed to analyze the spatial defect pattern of said dice on said wafer.

11. The method of claim 10, wherein said spatial defect pattern analysis comprises providing signature patterns of respective systematic defects in digital data bitstream formats that correspond to the format of said test digital data bitstream, and correlating said test digital data bitstream with said signature patterns.

12. The method of claim 1, wherein said multiple wafers are manufactured in succession, and the data bitstream for one wafer is processed during manufacture of the next successive wafer.

13. The method of claim 12, wherein the data bitstreams for said wafers are processed to distinguish between random and systematic defects, and the results for one of said wafers is used to modify the manufacturing process for subsequent wafers in response to detected systematic defects.

14. The method of claim 1, wherein said testing is performed by a test device that generates a test output, and said digital data bitstream is generated from said test output without manual intervention.

* * * * *